United States Patent
Komiyaji et al.

(10) Patent No.: US 10,658,216 B2
(45) Date of Patent: May 19, 2020

(54) TRANSFER SYSTEM AND TRANSFER METHOD

(71) Applicant: KABUSHIKI KAISHA YASKAWA DENKI, Kitakyushi-shi (JP)

(72) Inventors: Osamu Komiyaji, Fukuoka (JP); Hiroki Sanemasa, Fukuoka (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 0 days.

(21) Appl. No.: 16/451,009

(22) Filed: Jun. 25, 2019

(65) Prior Publication Data

US 2020/0051846 A1 Feb. 13, 2020

Related U.S. Application Data

(60) Provisional application No. 62/716,634, filed on Aug. 9, 2018.

(51) Int. Cl.
- H01L 21/677 (2006.01)
- H01L 21/67 (2006.01)
- B25J 9/00 (2006.01)
- H01L 21/687 (2006.01)
- B65G 47/90 (2006.01)

(52) U.S. Cl.
CPC ...... H01L 21/67745 (2013.01); B25J 9/0087 (2013.01); B65G 47/907 (2013.01); H01L 21/67196 (2013.01); H01L 21/67742 (2013.01); H01L 21/68707 (2013.01)

(58) Field of Classification Search
CPC ... B25J 9/0087; B25J 9/042; H01L 21/67745; H01L 21/67196; H01L 21/67742; H01L 21/68707; B25G 47/907
See application file for complete search history.

(56) References Cited

U.S. PATENT DOCUMENTS

| | | | | |
|---|---|---|---|---|
| 5,810,549 A | * | 9/1998 | Wytman | H01L 21/67742 414/726 |
| 2005/0102064 A1 | * | 5/2005 | Donoso | H01L 21/67259 700/254 |
| 2011/0262251 A1 | * | 10/2011 | Otogawa | H01L 21/67766 414/222.02 |
| 2013/0121798 A1 | * | 5/2013 | Hosek | H01L 21/677 414/744.5 |
| 2015/0063954 A1 | * | 3/2015 | Mitchell | H01L 21/67745 414/217 |

FOREIGN PATENT DOCUMENTS

JP 2011-228559 11/2011

* cited by examiner

*Primary Examiner* — Gerald McClain
(74) *Attorney, Agent, or Firm* — Mori & Ward, LLP

(57) ABSTRACT

A transfer system includes a transfer chamber having transfer positions, a first robot provided in the transfer chamber to transfer articles between the transfer positions, a second robot provided in the transfer chamber to transfer articles between the transfer positions, and a retreat unit configured to move one robot among the first robot and the second robot to a retreat position by changing a height of the one robot such that the one robot does not interfere with an operating range of another robot among the first robot and the second robot.

10 Claims, 11 Drawing Sheets

TRANSFER SYSTEM AND TRANSFER METHOD

CROSS-REFERENCE TO RELATED APPLICATIONS

The present application claims priority under 35 U.S.C. §119(e) to U.S. Provisional Patent Application No. 62/716,634, filed Aug. 9, 2018. The contents of this application are incorporated herein by reference in their entirety.

BACKGROUND OF THE INVENTION

Field

A disclosed embodiment relates to a transfer system and a transfer method.

Background

A transfer system has conventionally been known in which a robot such as a horizontal articulated robot that includes a hand that holds a substrate is arranged in a locally-cleaned transfer chamber and the substrate is transferred to substrate housing cassettes installed on side walls of the transfer chamber or substrate processing chambers.

Furthermore, a technology is also proposed in which two robots for each processing chamber are installed in a transfer chamber so that a transfer process is continued even when one of the robots is broken down (for example, Japanese Patent Application Publication No. 2011-228559).

However, when two robots are simply installed for each processing chamber like the technology as described above, exclusive control to prevent the two robots from interfering with each other has to be executed and costs increase. That is, there is room for improvement in preventing an increase in costs of the conventional transfer system.

SUMMARY

According to an aspect of an embodiment, a transfer system includes a transfer chamber having transfer positions; a first robot provided in the transfer chamber to transfer articles between the transfer positions; a second robot provided in the transfer chamber to transfer articles between the transfer positions; and a retreat unit configured to move one robot among the first robot and the second robot to a retreat position by changing a height of the one robot such that the one robot does not interfere with an operating range of another robot among the first robot and the second robot.

According to another aspect of an embodiment, a transfer system includes a transfer chamber having first transfer positions and second transfer positions; a first robot provided in the transfer chamber to transfer articles between the first transfer positions; and a second robot provided in the transfer chamber to transfer articles between the second transfer positions and configured to transfer articles between the first transfer positions when the first robot does not transfer articles between the first transfer positions.

According to further aspect of an embodiment, a transfer method includes providing a first robot in a transfer chamber to transfer articles between the transfer positions in the transfer chamber; providing a second robot in the transfer chamber to transfer articles between the transfer positions in the transfer chamber; and moving one robot among the first robot and the second robot to a retreat position by changing a height of the one robot such that the one robot does not interfere with an operating range of another robot among the first robot and the second robot.

BRIEF DESCRIPTION OF DRAWINGS

A more complete appreciation of the present invention or the attendant advantages thereof will be readily understood when reading the following detailed description in connection with the accompanying drawings, wherein.

DESCRIPTION OF EMBODIMENTS

Figure 1:
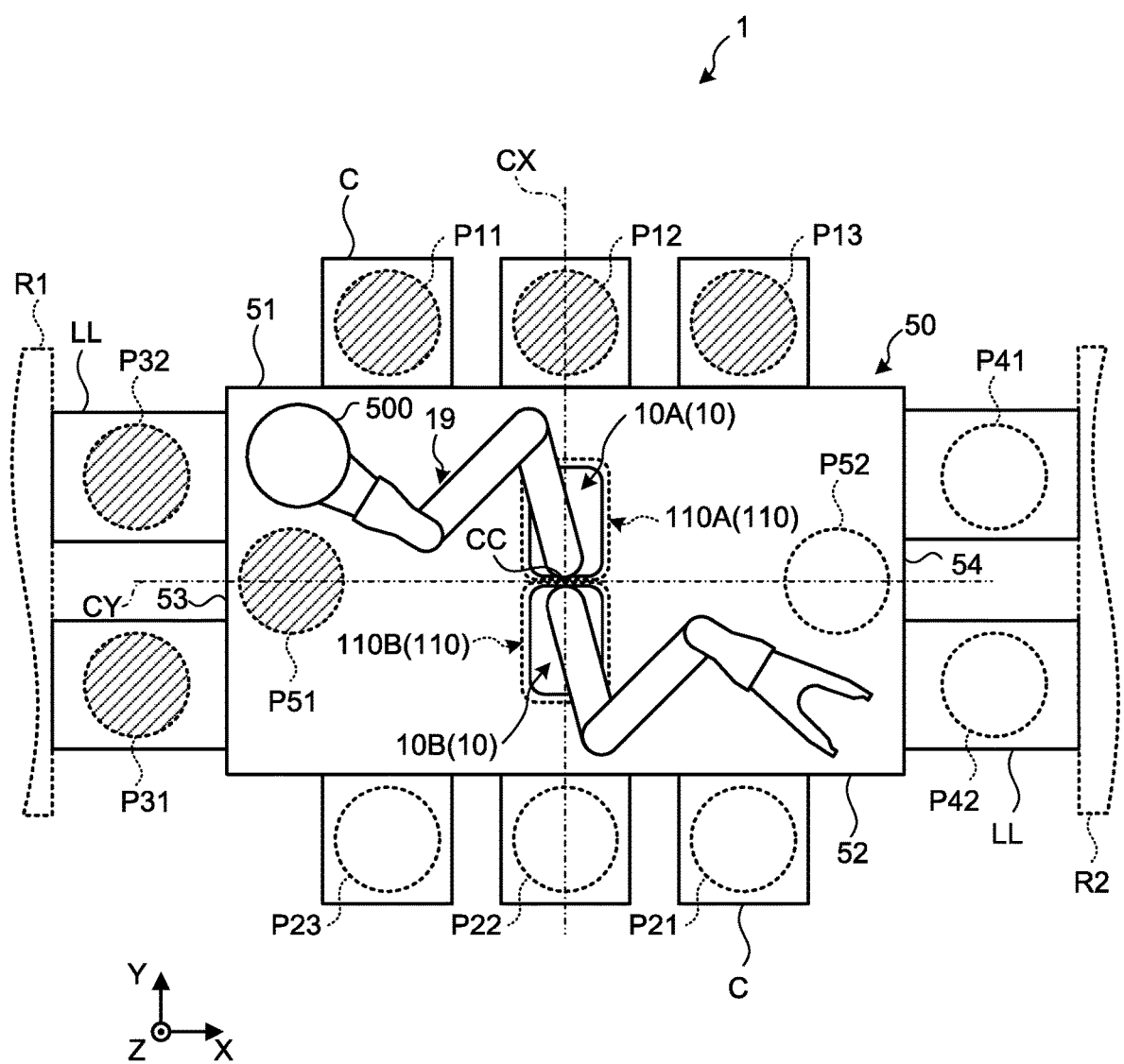
FIG. 1 is a schematic top view illustrating an outline of a transfer system.

The embodiments will now be described with reference to the accompanying drawings, wherein like reference numerals designate corresponding or identical elements throughout the various drawings.

Hereinafter, a transfer system and a transfer method as disclosed in the present application will be described in detail with reference to the accompanying drawings. Additionally, the present invention is not limited by embodiments as described below.

Furthermore, in the embodiments described below, an expression of "parallel", "perpendicular", "horizontal", "vertical", "central", or "symmetrical" may be used but does not have to satisfy such a condition strictly. That is, each expression as mentioned above allows a tolerance for manufacturing accuracy, installation accuracy, processing accuracy, detection accuracy, or the like.

First, an outline of a transfer system 1 according to an embodiment will be described by using FIG. 1. FIG. 1 is a schematic top view illustrating an outline of the transfer system 1. Additionally, for the sake of better understanding of explanation, FIG. 1 illustrates a three-dimensional Cartesian coordinate system with a Z-axis with a positive direction that is a vertically upward direction, an X-axis with a direction along a long side of a transfer chamber 50, and a Y-axis with a direction along a short side of the transfer chamber 50 is illustrated. Such a Cartesian coordinate system may also be illustrated in other drawings that are used in the following description.

As illustrated in FIG. 1, the transfer system 1 includes the transfer chamber 50, robots 10, and supporting devices 110. Additionally, as illustrated in FIG. 1, the transfer system 1 includes the two robots 10, so that when the robots 10 are distinguished from each other, they are described as a robot 10A and a robot 10B. Furthermore, for the supporting devices 110, the supporting device 110 that corresponds to the robot 10A will be described as a supporting device (a lift or an additional lift) 110A, and the supporting device 110 that corresponds to the robot 10B will be described as a supporting device (a lift or an additional lift) 110B.

The transfer chamber 50 is a so-called Equipment Front End Module (EFEM), and is a locally-cleaned casing where clean down-flow air flows into inside thereof. Furthermore, filling the transfer chamber 50 with nitrogen (N2) purge) is also executed. When N2 purge is executed in the transfer chamber 50, once the transfer chamber 50 is opened, it takes time to restore the state of N2 purge, so that it is preferable to continue a transfer process without opening the transfer chamber 50 even when the robots 10 are broken down.

First, the transfer chamber 50 will be described. As illustrated in FIG. 1, the transfer chamber 50 has, for example, a rectangular shape with long sides in an X-axis direction and short sides in a Y-axis direction in the figure, where a first side wall 51 and a second side wall 52 that correspond to the long sides face each other. Furthermore, a third side wall 53 and a fourth side wall 54 that correspond to the short sides face each other. Additionally, in the following, a center line with respect to the Y-axis direction of the transfer chamber 50 is referred to as a center line CY, a center line with respect to the X-axis direction is referred to as a center line CX, and a point of intersection between the center line CY and the center line CX is referred to as a center point CC.

Additionally, although FIG. 1 illustrates the transfer chamber 50 with a rectangular shape that is surrounded by the first side wall 51 and the second side wall 52 that face each other and the third side wall 53 and the fourth side wall 54 that face each other, a shape of the transfer chamber 50 is not limited thereby. That is, as long as at least the first side wall 51 and the second side wall 52 that face each other and the third side wall 53 and the fourth side wall 54 that face each other are included, other shapes such as a hexagonal shape may be provided.

Three cassettes C are arranged side by side outside each of the first side wall 51 and the second side wall 52. Herein, the cassettes C are so-called Front-Opening Unified Pods (FOUPs), and are devices that house a substrate 500 in a multistage manner. The substrate 500 is housed in such a manner that a reference position (for example, a center) of the substrate 500 overlaps with a transfer position P11, for example. Herein, the transfer position P11 is an example of a plurality of transfer positions P that are determined preliminarily in the transfer chamber 50.

Two load lock chambers LL are arranged side by side on each of the third side wall 53 and the fourth side wall 54. Herein, the load lock chambers LL correspond to chambers at a stage prior to processing chambers R1 and R2, and the substrate 500 that is a processing target is transferred thereto one by one.

Herein, dimensions, such as positions, sizes, and intervals, of openings that are provided on the first side wall 51 and the second side wall 52 for mounting the cassettes C conform to the Semiconductor Equipment and Materials International (SEMI) standard. Furthermore, various dimensions of the cassettes C as described above also conform to the SEMI standard similarly.

Furthermore, dimensions, such as positions, sizes, and intervals, of openings that are provided on the third side wall 53 and the fourth side wall 54 for mounting the load lock chambers LL, and various dimensions of the load lock chambers LL also conform to the SEMI standard similarly.

As illustrated in FIG. 1, the transfer position P for the substrate 500 is determined preliminarily in each of the cassettes C. Additionally, although FIG. 1 illustrates the transfer positions P as circular shapes similar to the substrate 500, centers of the circular shapes may be provided as the transfer positions P.

Herein, the transfer positions P for the three cassettes C on the first side wall 51 are referred to as a transfer position P11, a transfer position P12, and a transfer position P13 in a clockwise direction, respectively. Furthermore, a transfer position P21, a transfer position P22, and a transfer position P23 are also provided on the second side wall 52 similarly.

Furthermore, the transfer positions P in the load lock chambers LL on the third side wall 53 are referred to as a transfer position P31 and a transfer position P32 in a clockwise direction, respectively. Furthermore, a transfer position P41 and a transfer position P42 are also provided on the fourth side wall 54 similarly.

Additionally, a transfer position P51 and a transfer position P52 are the transfer positions P that correspond to a pre-aligner PA (see FIG. 7) that aligns a crystal orientation of the substrate 500. Furthermore, the transfer position P51 and the transfer position P52 are arranged on the center line CY so as to be line-symmetric with respect to the center line CX. The transfer positions P51 and 52 are not necessarily arranged on the center line CY.

Thus, each of the transfer positions P is determined preliminarily so as to be symmetric with respect to both of the center line CX and the center line CY. Additionally, although FIG. 1 illustrates a case where the transfer positions P are arranged so as to be symmetric with respect to the center line CX and the center line CY, the symmetrical arrangement is an example of arrangement, and symmetrical arrangement does not have to be provided with respect to one or both of the center line CX and the center line CY. The same applies to arrangement of the robots 10 as described below.

Next, the robots 10 will be described. In the following, the robot 10 on the first side wall 51 side is referred to as the robot 10A, and the robot 10 on the second side wall 52 side is referred to as the robot 10B. Additionally, when both of them need not be distinguished from each other, they are described as the robots 10. Each of the robots 10 transfers the substrate 500 between the cassettes C and the load lock chambers LL.

As illustrated in FIG. 1, the robots 10 include horizontal articulated arm parts 19. Furthermore, each of the robots 10 is arranged in such a manner that a pivot axis of an arm on the proximal end of the arm part 19 is located on the center line CX. Then, the robot 10A is arranged on the first side wall 51 side relative to the center line CY and the robot 10B is arranged on the second side wall 52 side relative to the center line CY so as to be adjacent thereto while interposing the center line CY therebetween.

Herein, arm lengths of the arm parts 19 are to be capable of transferring the substrate 500 to all of the transfer positions P illustrated in FIG. 1. That is, the arm lengths of the arm parts 19 of the robots 10A and 10B are to be capable of transferring the substrate 500 to each of the transfer positions P on the first side wall 51, the second side wall 52, the third side wall 53, and the fourth side wall 54. Additionally, a detail of a configuration of the robots 10 will be described later by using FIG. 3 and FIG. 4.

The robot 10A transfers the substrate 500 between the transfer positions P11, P12, and P13 that correspond to the cassettes C on the first side wall 51 and the transfer positions P31 and P32 that correspond to the load lock chambers LL on the third side wall 53. Furthermore, the robot 10B transfers the substrate 500 between the transfer positions P21, P22, and P23 that correspond to the cassettes C on the second side wall 52 and the transfer positions P41 and P42 that correspond to the load lock chambers LL on the fourth side wall 54.

Thus, in normal times, the robot 10A executes a transfer process related to the processing chamber R1, and the robot 10B executes a transfer process related to the processing chamber R2. That is, the single robot 10 executes the transfer process for the single processing chamber R, so that the number of the robots 10 for the single processing chamber R is one. Thereby, it is possible to reduce costs for the single processing chamber R.

Additionally, for the sake of better understanding of explanation, the transfer positions P (the transfer positions P11, P12, P13, P31, P32, and P51) that are handled by the robot 10A are hatched in FIG. 1. Furthermore, the transfer positions P (the transfer positions P21, P22, P23, P41, P42, and P52) without hatching are handled by the robot 10B. Additionally, the transfer positions P that are handled by the robots 10A and 10B may be interchanged with each other. Furthermore, the robots 10 that handle the transfer positions P51 and P52 that correspond to the pre-aligners PA (see FIG. 7) may be interchanged with each other. That is, the transfer position P51 and the transfer position P52 may be handled by the robot 10B and the robot 10A, respectively.

As illustrated in FIG. 1, the transfer positions P11, P12, P13, P31, P32, and P51 that are handled by the robot 10A and the transfer positions P21, P22, P23, P41, P42, and P52 that are handled by the robot 10B have point-symmetric relationships with respect to the center point CC. Furthermore, the transfer positions P11, P12, and P13 and the transfer positions P23, P22, and P21 have line-symmetric relationships with respect to the center line CY, and the transfer positions P31, P32, and P51 and the transfer positions P42, P41, and P52 have line-symmetric relationships with respect to the center line CX.

Next, the supporting devices 110 will be described. The supporting devices 110 are devices that change support heights of the robots 10. Herein, the supporting devices (lifts) 110 are examples of a "retreat unit" that, when one of the robots 10 is broken down, causes the broken-down robot 10 to retreat to a height at which interference with an operating range of the other (normal) robot 10 is not caused.

Thus, the transfer system 1 causes the two robots 10 to execute transfer processes in normal times, and when one of the robots 10 is broken down, causes the broken-down robot 10 to retreat in a height direction (Z direction) so that the transfer processes are continued by the other (normal) robot 10.

For example, when the robot 10B that corresponds to the processing chamber R2 is broken down, the supporting device 110B lifts the robot 10B down to a height at which interference with an operating range of the robot 10A is not caused. Then, the robot 10A that corresponds to the processing chamber R1 also transfers the substrate 500 to the transfer positions P that corresponds to the processing chamber R2.

That is, the robot 10A executes a transfer process that corresponds to the processing chamber R2 in addition to a transfer process that corresponds to the processing chamber R1. Thus, the reason why the robot 10A is able to additionally execute the transfer process of the robot 10B is that the robot 10A has the arm length capable of transferring the substrate 500 to all of the transfer positions P illustrated in FIG. 1 as described above.

Additionally, although the case where the robot 10B is broken down is described herein, when the robot 10A is broken down, the supporting device 110A causes the robot 10A to retreat and the robot 10B transfers the substrate 500 to all of the transfer positions P illustrated in FIG. 1.

Additionally, FIG. 1 illustrates two independent devices such as the supporting device 110A that supports the robot 10A and the supporting device 110B that supports the robot 10B, for the supporting devices 110. However, this is not limiting and the single supporting device 110 may separately change the respective support heights of the robots 10A and 10B. Furthermore, the functions of the supporting device 110 may be provided to each of the robots 10.

Figure 2:
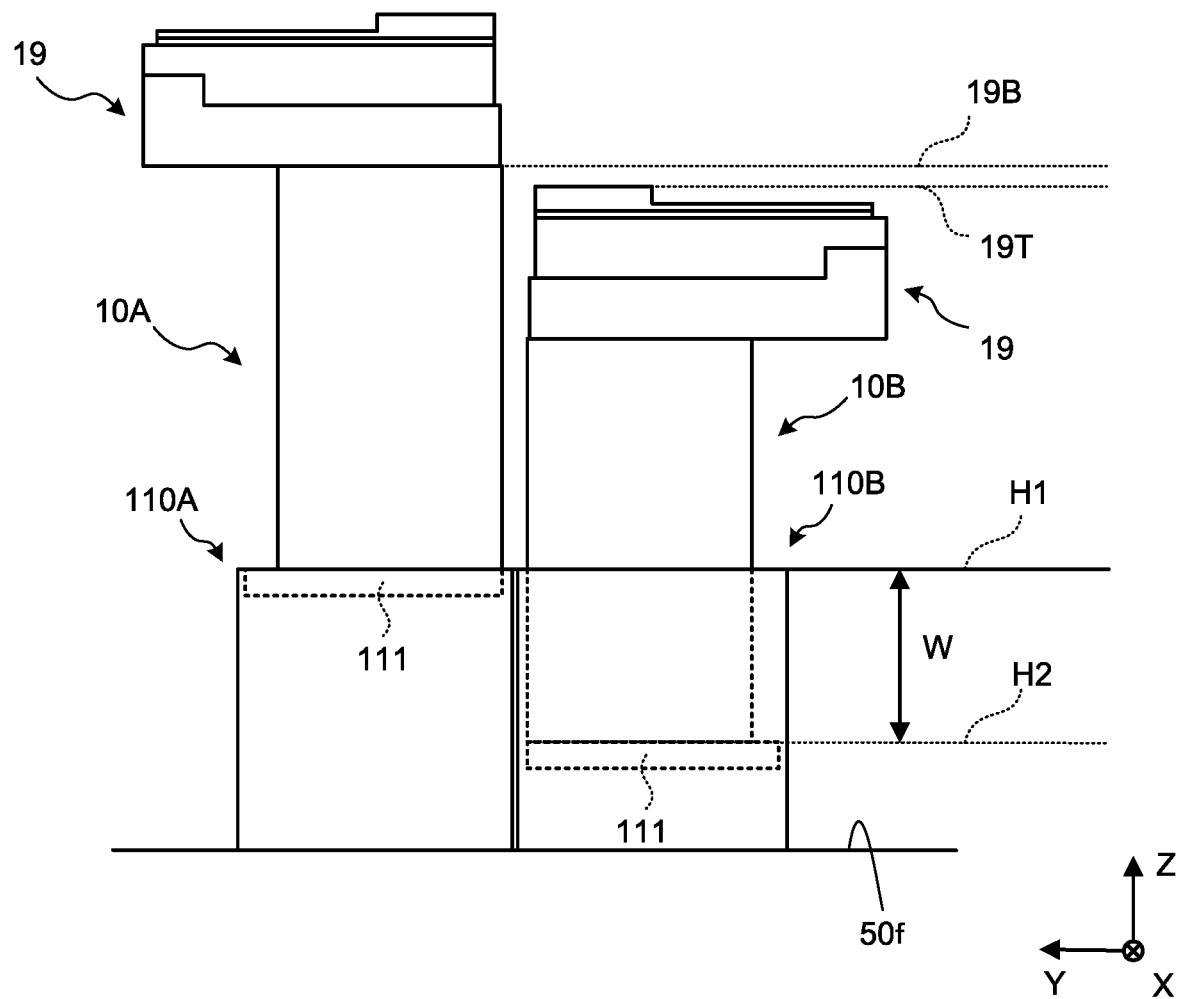
FIG. 2 is a side view of a supporting device.

Next, a retreat operation that is executed by the supporting devices 110 will be described by using FIG. 2. FIG. 2 is a side view of the supporting devices 110. In particular, FIG. 2 is a view in which the robots 10 and the supporting devices 110 are viewed from the third side wall 53 side (the negative direction side of the X-axis) in FIG. 1.

Additionally, FIG. 2 illustrates a case where the supporting device 110A supports the robot 10A at a first height H1 that is a height in normal times (height before retreat), and the supporting device 110B supports the robot 10B at a second height H2 that is a height after retreat.

As illustrated in FIG. 2, the supporting devices 110A and 110B are installed on a floor surface 50f of the transfer chamber 50 and respectively support the robots 10A and 10B, for example. The supporting devices 110 include lifting parts 111, and upon receiving a lift-down instruction, lift top surfaces of the lifting parts 111 down from the first height H1 to the second height H2. Herein, for an operating system of the lifting parts 111, it is possible to use a pneumatic system or a hydraulic system.

For example, it is possible to close a valve by an actuator that operates against a biasing force to stop the lifting parts 111 at the first height H1 when power is supplied, and open the valve by the biasing force to release pressure and lift down the lifting parts 111 to the second height H2 when power supply is disconnected. Thus, it is possible to reduce the power consumption in normal times (when power is supplied). Additionally, it is possible to readily change a lift-down speed by adjusting the amount of opening of the valve.

Additionally, an electrical system may be used for the operating system of the lifting parts 111. Furthermore, a manual system as well as an automatic system may be provided for the lifting parts 111. For the manual system, it is possible to use a lifting mechanism, such as a jack, with an operating handle arranged outside the transfer chamber 50, for example. The operating handle is arranged outside the transfer chamber 50, so that, when the robot 10 is broken down, it is possible to cause the broken-down robot 10 to retreat without opening the transfer chamber 50. Furthermore, a semi-automatic system may be provided in which an operating button is provided outside the transfer chamber 50 and a retreat operation is started by pushing the operating button. Thus, it is possible for the retreat unit to be an automatic system, a manual system, or a semi-automatic system.

As illustrated in FIG. 2, the second height H2 is less than the first height Furthermore, it is sufficient that a lift-down width W that is a difference between the first height H1 and the second height H2 is an amount such that an upper edge height 19T of the arm part 19 of the robot 10B after retreat is less than a lower edge height 19B of the arm part 19 of the robot 10A before retreat.

Thus, even when the arm part 19 of the (normal) robot 10A before retreat operates, interference with the (broken-down) robot 10B after retreat is not caused. Therefore, it is also possible for the robot 10A to access the transfer positions P21, P22, and P23 on the robot 10B side.

Additionally, although FIG. 2 illustrates a case where the two supporting devices 110A and 110B respectively support the two robots 10A and 10B and cause them to retreat, the two lifting parts 111 that independently operate may be included in the single supporting device 110. Furthermore, although FIG. 2 illustrates a case where the lifting parts 111 is lifted up and down inside the supporting devices 110, the supporting devices 110 may be configured in such a manner that the externally-exposed lifting parts 111 is lifted up and down.

Figure 3:
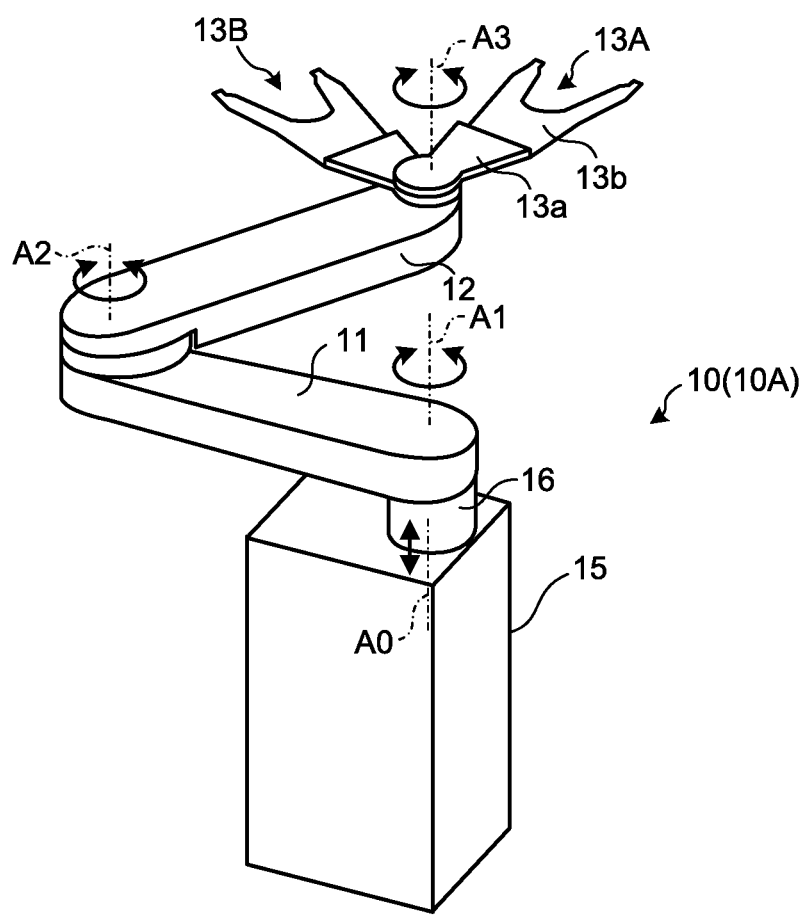
FIG. 3 is a perspective view of a robot.
Figure 4:
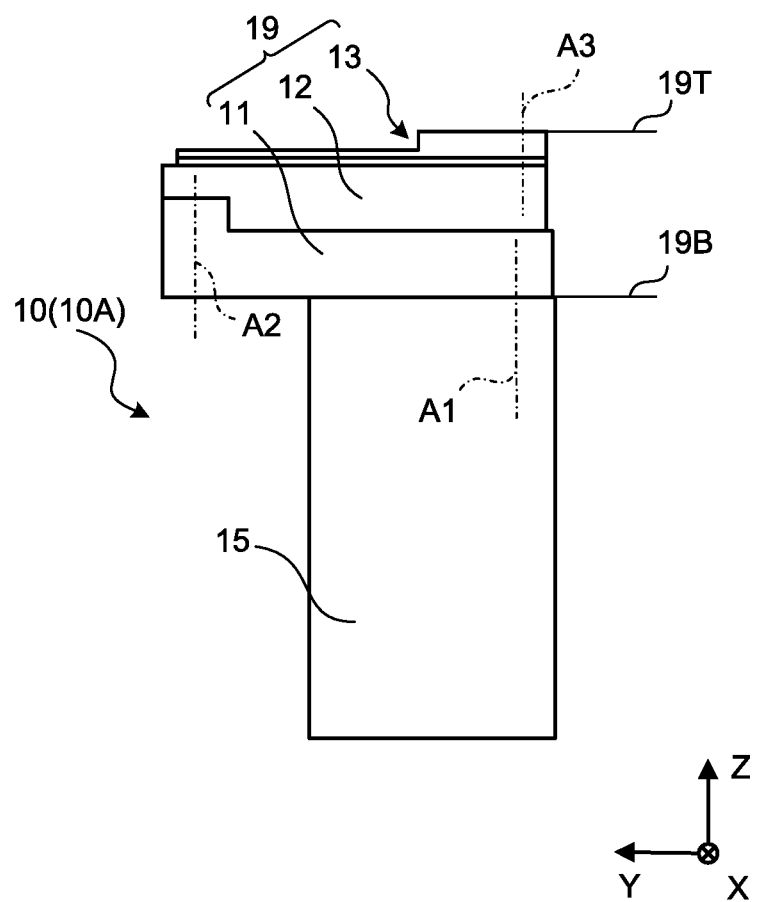
FIG. 4 is a side view of the robot.

Next, a configuration of the robots 10 will be described by using FIG. 3 and FIG. 4. FIG. 3 is a perspective view of the robot 10A, and FIG. 4 is a side view of the robot 10A. Additionally, FIG. 3 corresponds to a view in which the robot 10A is viewed from obliquely upward, and FIG. 4 corresponds to a view in which the robot 10A is viewed from the third side wall 53 side (the negative direction side of the X-axis). Furthermore, although FIG. 3 and FIG. 4 are diagrams relating to the robot 10A by taking its orientation into consideration, in the case of the robot 10B, it is sufficient to interchange positive and negative directions of the Y-axis in FIG. 3 and FIG. 4.

As illustrated in FIG. 3, the robot 10A includes a main body part 15, a lifting part 16, a first arm 11, a second arm 12, and hands 13. Additionally, although FIG. 3 illustrates a hand 13A and a hand 13B as the two hands 13 that coaxially pivot, the single hand 13 may be provided.

The main body part 15 is mounted on the supporting device 110A (see FIG. 2), and includes a built-in lifting mechanism (not illustrated) that lifts the lifting part 16 up and down. For the lifting mechanism, it is possible to use a mechanism that includes a ball screw oriented along the Z-axis, a slider that slides on the ball screw, and an actuator that rotates the ball screw, for example.

The lifting part 16 supports a proximal end of the first arm 11 to be rotatable around a first axis A1, and lifts it up and down along a lifting axis A0. Additionally, the lifting part 16 itself may be rotated around the first axis A1. Furthermore, the first axis A1 is arranged on the negative direction side of the Y-axis on a top surface of the main body part 15. This is because, when the first axis A1 is arranged on the negative direction side in the figure, it is possible to increase the length of the first arm 11 in a range in which interference with the transfer chamber 50 is not caused.

The first arm 11 supports, at a distal end thereof, a proximal end of the second arm 12 to be rotatable around a second axis A2. The second arm 12 supports, at a distal end thereof, a proximal end of each of the hands 13 to be rotatable around a third axis A3.

Furthermore, each of the hands 13 includes a base part 13a and a fork part 13b. Proximal end sides of the base parts 13a are supported by the second arm 12 to be rotatable around the third axis A3. The fork parts 13b are provided on distal end sides of the base parts 13a, and distal end sides thereof are bifurcated. Holding members that prevent the substrate 500 from sliding, such as O rings, are provided on top surfaces of the fork parts 13b. Additionally, other holding mechanisms, such as gripping mechanisms or adsorbing mechanisms, may be provided instead of the holding members.

Thus, the robot 10A is a three-link horizontal articulated robot with the first arm 11, the second arm 12, and the hands 13. Furthermore, the robot 10A includes the lifting mechanism as described above, so that it is possible to access each of the substrates 500 that are arranged in the cassettes C in a multistage manner. Additionally, the robot 10A may be configured to have two links or four or more links.

Furthermore, the robot 10A changes a height of the hands 13 by an operation of the lifting mechanism as described above, so that it is possible to access the transfer positions P in the load lock chambers LL as well as the transfer positions P in the pre-aligners PA. Additionally, a detail of such a matter will be described later by using FIG. 7.

Additionally, for a driving source of the first arm 11 and the second arm 12, it is possible to use a direct drive (DD) motor. Each of the first arm 11 and the second arm 12 is caused to pivot by the DD motor, so that it is possible to attain reduction of oscillation and improvement of transfer accuracy. Herein, when the DD motor is used for the driving source, it is preferable to use a rotation preventive brake in combination to prevent rotation that is caused by an external force.

As illustrated in FIG. 4, the second arm 12 is provided above the first arm 11, and the hands 13 are provided above the second arm 12. Additionally, the first arm 11, the second arm 12, and the hands 13 are collectively referred to as the arm part 19 (see FIG. 1). Additionally, although FIG. 4 illustrates a case where the lifting part 16 is entirely hidden by the main body part 15 as an example in which the arm part 19 is provided at the lowest position, a part of the lifting part 16 may protrude from the main body part 15.

Figure 5:
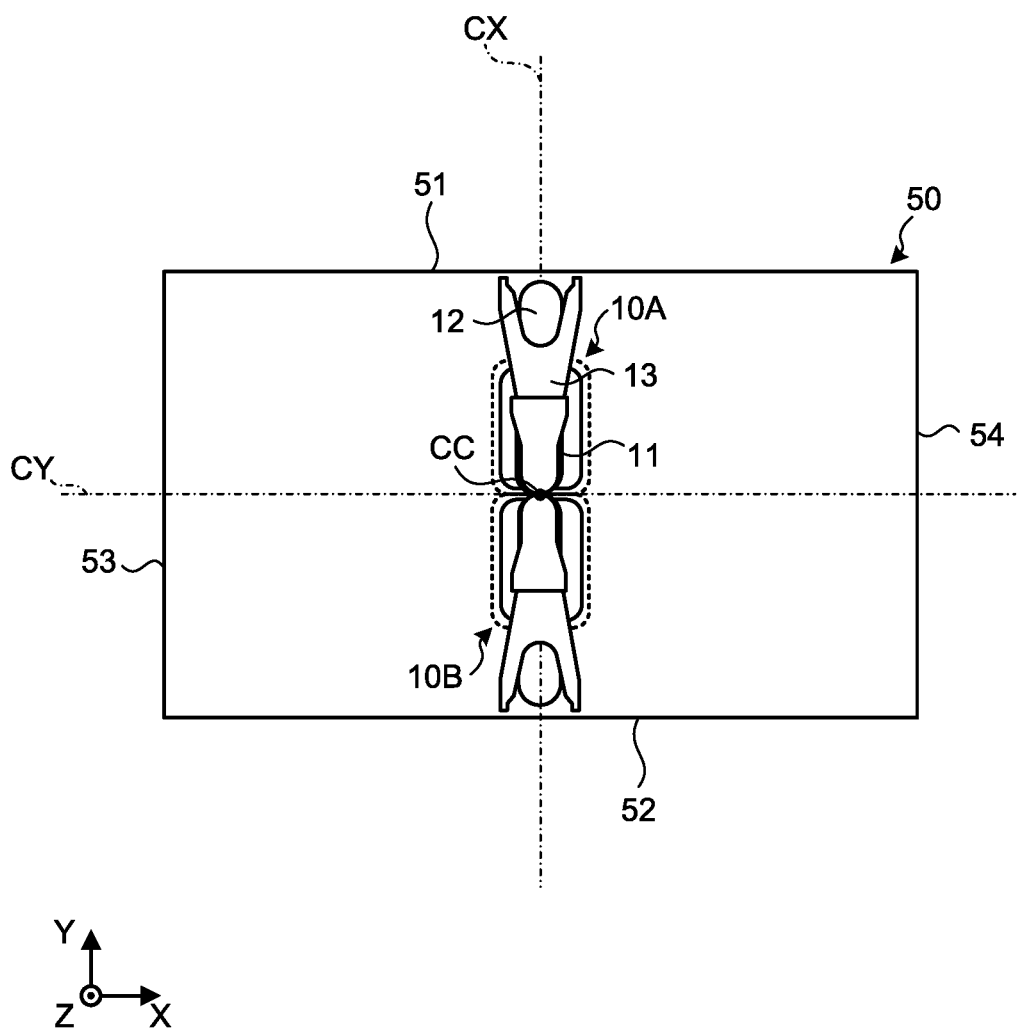
FIG. 5 is an explanatory diagram of a basic posture.

Next, a basic posture of the robot 10 will be described by using FIG. 5. FIG. 5 is an explanatory diagram of the basic posture. Additionally, although FIG. 5 illustrates the robot 10A and the robot 10B, the robots 10A and 10B have a symmetrical relationship with respect to the center line CY, so that the basic posture of the robot 10A will be described below.

As illustrated in FIG. 5, the basic posture of the robot 10A is a posture in which a stretching direction of each of the first arm 11, the second arm 12, and the hands 13 is folded in the direction along the center line CX. That is, a posture is provided in which the first arm 11, the second arm 12, and the hand 13 are folded so as to overlap with one another and be perpendicular to the first side wall 51. Additionally, it is also possible to provide a posture in which the first axis A1, the second axis A2, and the third axis A3 illustrated in FIG. 3 and FIG. 4 are folded so as to overlap with the center line CX.

As the robot 10A is caused to have the basic posture, interference with the robot 10B is not readily caused. Furthermore, as the robot 10A is forced to have the basic posture at the time of breakdown thereof, it is possible to prevent interference with the cassettes C or the load lock chambers LL that is involved with lift-down.

Additionally, for a method of forcing the robot 10A to have the basic posture at the time of breakdown thereof, a method of continuing an operation until the basic posture is attained by using a battery that operates when a power supply is disconnected, or a method of having the basic posture by a driving system in a system different from that of a normal driving system. Furthermore, a method may be provided in which a biasing force toward the basic posture is added to each of the rotation axes of the robot 10A and an operation is executed against such biasing force in normal times.

Additionally, as the broken-down robot 10 is caused to have the basic posture, it is possible for the normal robot 10 to access a part of the cassettes C (see FIG. 1) on the broken-down robot 10 side without lifting the broken-down robot 10 down. For example, as the robot 10B has the basic posture, it is possible for the robot 10A to access the transfer positions P23 and P21 at both ends (see FIG. 1). Furthermore, it is also possible to access the transfer positions P41 and P42 for the processing chamber R2 (see FIG. 1).

Figure 6:
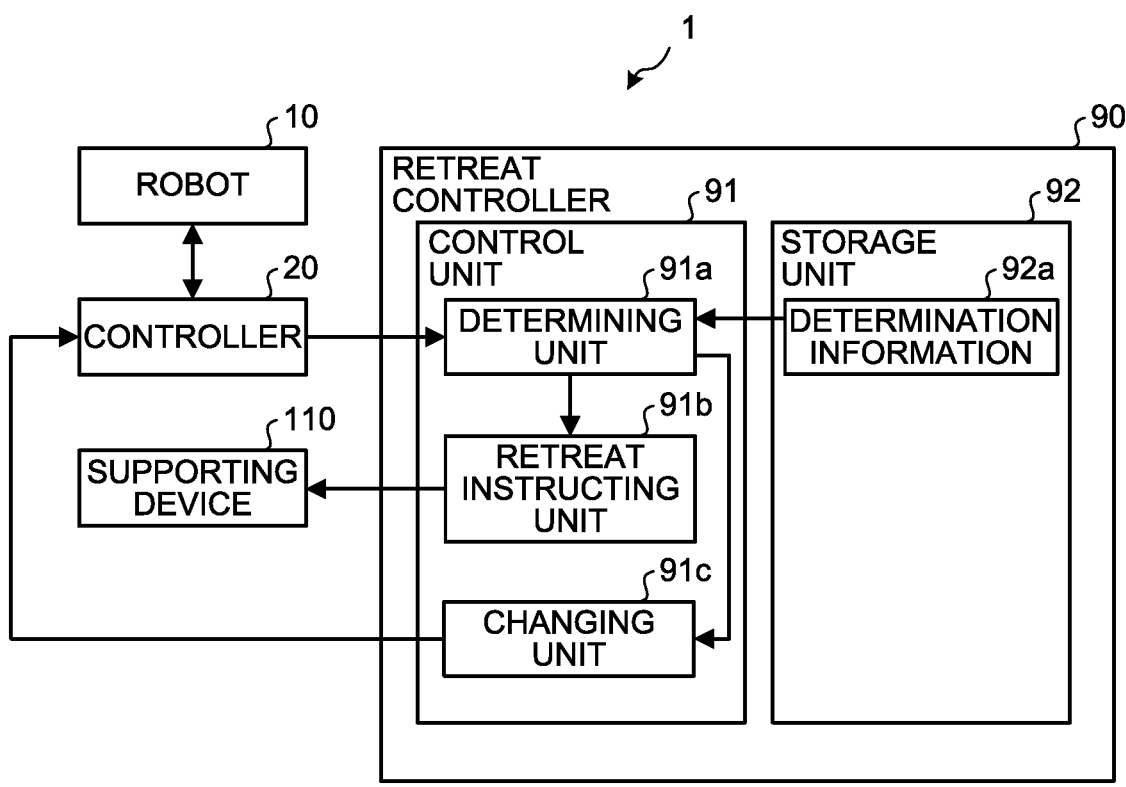
FIG. 6 is a block diagram of the transfer system.

Next, a configuration of the transfer system 1 will be described by using FIG. 6. FIG. 6 is a block diagram of the transfer system 1. Additionally, FIG. 6 omits illustration of a controller that executes entire control of transfer chamber 50 (see FIG. 1). Additionally, the above-described controller that executes entire control may implement functions of a retreat controller 90 illustrated in FIG. 6

As illustrated in FIG. 6, the transfer system 1 includes the robot 10, a controller 20 that executes operation control of the robot 10, the supporting device 110, and the retreat controller 90. Additionally, although FIG. 6 illustrates the single robot 10, the single controller 20, and the single supporting device 110 from the viewpoint of simplicity of explanation, the two robots 10, the two controllers 20, and the two supporting devices 110 are present in practice.

In the following, a configuration of the retreat controller 90 will be mainly described. Additionally, a configuration of the controller 20 that executes operation control of the robot 10 will be described later by using FIG. 8.

As illustrated in FIG. 6, the retreat controller 90 includes a control unit 91 and a storage unit 92. Moreover, the control unit 91 includes a determining unit 91a, a retreat instructing unit 91b, and a changing unit 91c. Furthermore, the storage unit 92 stores therein determination information 92a. Furthermore, the retreat controller 90 is connected to the controller 20 and the supporting device 110.

Herein, the retreat controller 90 includes a computer and various circuits that include, for example, a Central Processing Unit (CPU), a Read Only Memory (ROM), a Random Access Memory (RAM), a Hard Disk Drive (HDD), and an input-output port.

The CPU of the computer reads and executes a program stored in the ROM to function as the determining unit 91a, the retreat instructing unit 91b, and the changing unit 91c of the control unit 91, for example.

Furthermore, at least one or all of the determining unit 91a, the retreat instructing unit 91b, and the changing unit 91c of the control unit 91 are also capable of being composed of hardware such as an Application Specific Integrated Circuit (ASIC) or a Field Programmable Gate Array (FPGA). The CPU, the ASIC, and the FPGA are examples of circuitry.

Furthermore, a storage unit 22 corresponds to a RAM or an HDD, for example. It is possible for the RAM or the HDD to store therein the determination information 92a. Additionally, the retreat controller 90 may acquire the above-described program and various kinds of information via another computer or a portable recording medium connected by a wired or wireless network.

The control unit 91 of the retreat controller 90 executes control to cause the broken-down robot 10 to retreat. The determining unit 91a determines which of the two robots 10 is broken down on the basis of operation statuses of the robots 10 acquired from the two controllers 20 respectively and the determination information 92a. Herein, the determination information 92a is information that includes a condition under which the robots 10 are assumed to have been broken down.

For example, the determining unit 91a determines that the robot 10 that corresponds to the controller 20 that has acquired error information is broken down. Furthermore, the determining unit 91a may determine that the robot 10 that corresponds to the controller 20 for which periodic communication has been disconnected is broken down. Additionally, it is possible to readily change contents of the determination of breakdown by changing the determination information 92a. Then, the determining unit 91a notifies the retreat instructing unit 91b and the changing unit 91c of a determination result.

The retreat instructing unit 91b instructs the supporting device 110 that corresponds to the determination result received from the determining unit 91a to reduce the support height of the robot 10. For example, in the case illustrated in FIG. 1, the retreat instructing unit 91b that has received, from the determining unit 91a, the determination result indicating that the robot 10B is broken down instructs the supporting device 110B to execute lift-down.

The changing unit 91c instructs the controller 20 that corresponds to the determination result received from the determining unit 91a to change the posture of the robot 10. For example, in the case as illustrated in FIG. 1, the changing unit 91c that has received, from the determining unit 91a, the determination result indicating that the robot 10B is broken down instructs the controller 20 that corresponds to the robot 10B to cause the robot 10B to have the basic posture (see FIG. 5).

Additionally, although FIG. 6 illustrates a case where the changing unit 91c provides an instruction to change the posture of the robot 10 via the controller 20, the changing unit 91c may directly instruct the robot 10 to change the posture thereof. In this case, it is assumed that the robot 10 is provided with a driving system of a system different from the driving system for normal operation, and the changing unit 91c provides an instruction to the driving system of the different system.

Figure 7:
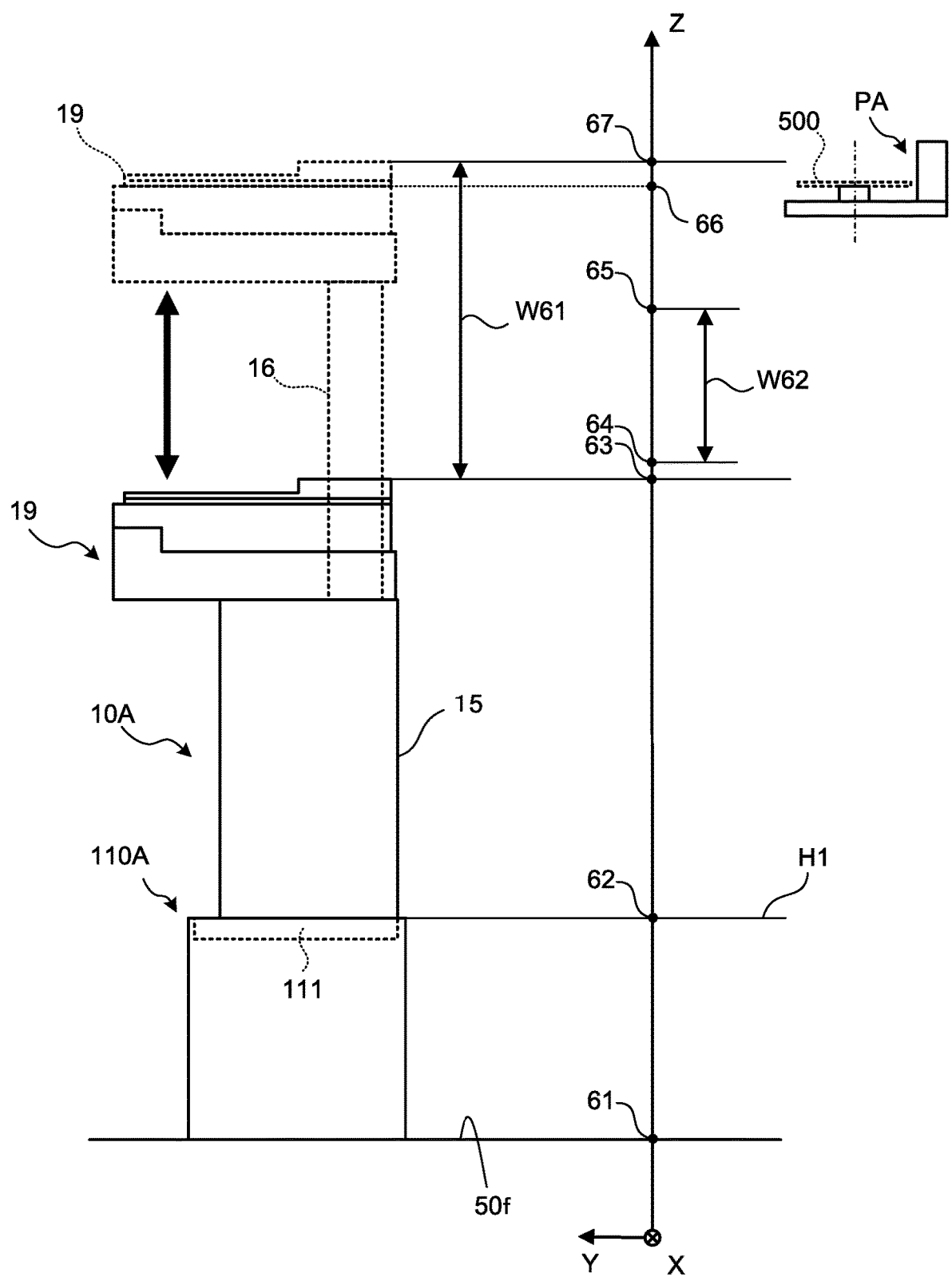
FIG. 7 is an explanatory diagram of a lifting range.

Next, a lifting range of the robot 10 will be described by using FIG. 7. FIG. 7 is an explanatory diagram of the lifting range. Additionally, although FIG. 7 illustrates the lifting range of the robot 10A, the same applies to the robot 10B. Furthermore, in FIG. 7, the arm part 19 that is lifted down to the minimum height with respect to the main body part 15 by lifting the lifting part 16 down and the arm part 19 that is lifted up to the maximum height with respect to the main body part 15 by lifting the lifting part 16 up are indicated by a solid line and a broken line, respectively.

As illustrated in FIG. 7, the supporting device 110A is arranged on the floor surface 50f of the transfer chamber 50 (see FIG. 1). A height of the floor surface 50f is a "height 61". Furthermore, the main body part 15 of the robot 10A is arranged on the lifting part 111 of the supporting device 110A. Herein, FIG. 7 illustrates a case where the top surface of the lifting part 111 is provided at the first height H1. A height of the first height H1 is a "height 62".

Furthermore, a height of the top surface of the arm part 19 in a case where the aim part 19 of the robot 10A is lifted down to the minimum height is a "height 63", and the height of the top surface of the arm part 19 in a case where the arm part 19 is lifted up to the maximum height is a "height 67". That is, a "lifting range W61" of the arm part 19 during a normal operation has a lower limit that is the height 63 and an upper limit that is the height 67.

Herein, as a minimum value of a "housing range W62" of the substrates 500 that are housed in the cassettes C in a multistage manner as illustrated in FIG. 1 is a "height 64" and a maximum value thereof is a "height 65", the height 64 is greater than the height 63 and the height 65 is less than the height 67. That is, the housing range W62 is included in the lifting range W61. Furthermore, heights of the transfer positions P of the substrate 500 conveyed to the load lock chambers LL illustrated in FIG. 1 are included in the housing range W62 of the cassettes C.

Then, a "height 66" of the substrate 500 mounted on the pre-aligner PA is greater than the housing range W62 of the cassettes C and less than the height 67 that is the height of the top surface of the arm part 19 lifted up to the maximum height. Additionally, the pre-aligner PA aligns crystal orientations of the substrate 500 by rotating the substrate 500 around an axis along the Z-axis. Thus, the respective heights illustrated in FIG. 7 have a relationship of "the height 67>the height 66>the height 65>the height 64>the height 63>the height 62>the height 61".

Figure 8:
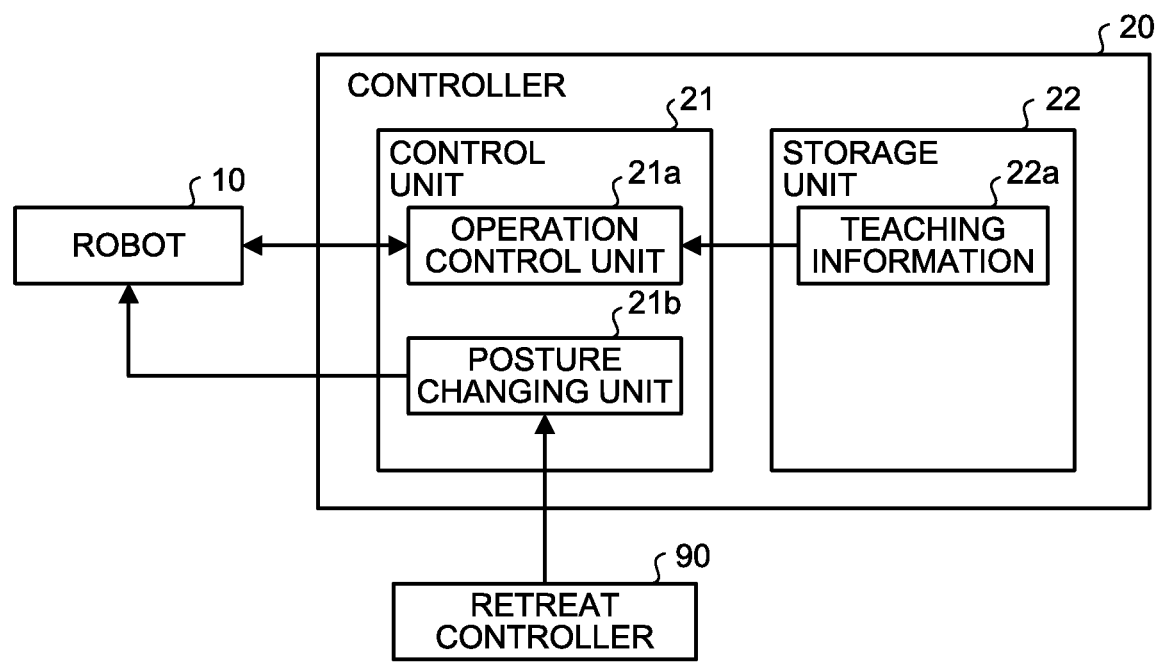
FIG. 8 is a block diagram of a controller.

Next, a configuration of the controller 20 illustrated in FIG. 6 will be described by using FIG. 8. FIG. 8 is a block diagram of the controller 20. As illustrated in FIG. 8, the robot 10 and the retreat controller 90 are connected to the controller 20. Furthermore, the controller 20 includes a control unit 21 and the storage unit 22. The control unit 21 includes an operation control unit 21a and a posture changing unit 21b. The storage unit 22 stores therein teaching information 22a.

Herein, the controller 20 includes a computer and various circuits that include, for example, a Central Processing Unit (CPU), a Read Only Memory (ROM), a Random Access Memory (RAM), a Hard Disk Drive (HDD), an input-output port, and the like.

The CPU of the computer reads and executes a program stored in the ROM to function as the operation control unit 21a and the posture changing unit 21b of the control unit 21. Furthermore, at least a part or all of the operation control unit 21a and the posture changing unit 21b are also capable of being composed of hardware such as an Application Specific Integrated Circuit (ASIC) or a Field Programmable Gate Array (FPGA).

Furthermore, the storage unit 22 corresponds to a RAM or an HDD, for example. It is possible for the RAM or the HDD to store therein the teaching information 22a. Additionally, the controller 20 may acquire the above-described program and various kinds of information via another computer or a portable recording medium connected by a wired or wireless network.

The control unit 21 executes operation control of the robot 10. The operation control unit 21a operates the robot 10 based on the teaching information 22a. Herein, the teaching information 22a is information that is generated in a teaching stage for the robot 10 and includes a "job" that is a program for defining an operating path of the robot 10. Additionally, the operation control unit 21a concurrently executes a process of improving operating accuracy based on a feedback value or the like from a built-in actuator of the robot 10.

The posture changing unit 21b executes a process of causing the robot 10 to have a retreat posture when receiving an instruction from the retreat controller 90 or the like. Herein, the retreat posture includes the "basic posture" as already described by using FIG. 5. Additionally, for the evacuating posture, a posture may be provided to cause at least the hands 13 in the cassettes C or the load lock chambers LL to retreat to the outside of the cassettes C or the load lock chambers LL.

Figure 9:
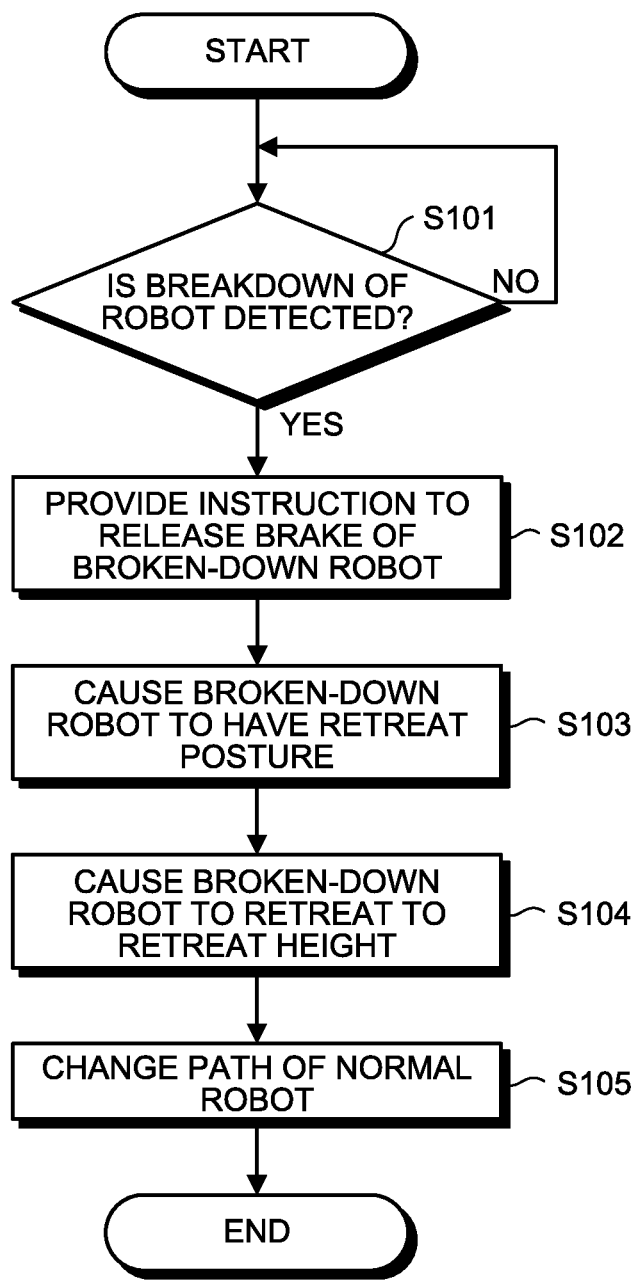
FIG. 9 is a flowchart illustrating steps of retreat that is executed by the transfer system.

Next, retreat steps that are executed by the transfer system 1 will be described by using FIG. 9. FIG. 9 is a flowchart illustrating retreat steps that are executed by the transfer system 1. Additionally, in the following, explanation will be provided with reference to the components illustrated in FIG. 6.

As illustrated in FIG. 9, the determining unit 91a of the retreat controller 90 detects breakdown of the robot 10 (Step S101). Then, if breakdown of the robot 10 is detected (Step S101: Yes), the changing unit 91c instructs the corresponding controller 20 to release a brake of the broken-down robot 10 (Step S102). Additionally, if the determination condition at Step S101 is not satisfied (Step S101: No), the process at Step S101 is repeated.

Subsequently, the changing unit 91c instructs the controller 20 that corresponds to the broken-down robot 10 to cause the broken-down robot 10 to have the retreat posture (Step S103). Then, the retreat instructing unit 91b instructs the supporting device 110 that corresponds to the broken-down robot 10 to cause the broken-down robot 10 to retreat to a retreat height (Step S104).

Furthermore, the changing unit 91c instructs the controller 20 that corresponds to the normal robot 10 to change a path in such a manner that the normal robot 10 additionally executes the transfer process of the broken-down robot 10 (Step S105), and terminates the process.

Additionally, such a path changing instruction is capable of being attained by changing the teaching information 22a illustrated in FIG. 8 from information on the path for the subject robot 10 to information including the paths for the subject robot 10 and the other robot 10, for example. Paths for the subject robot 10 and the other robot 10 may be prepared preliminarily so as to disable the path for the other robot 10 in normal times and enable such a path when the other robot 10 is broken down.

Figure 10A:
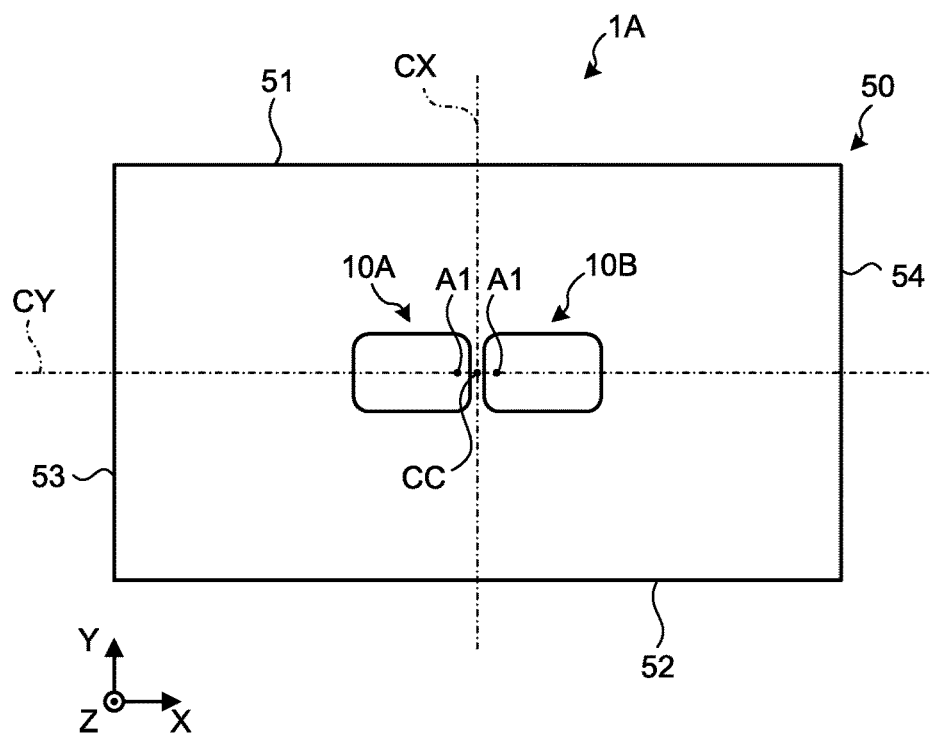
FIG. 10A is an explanatory diagram of a first variation.
Figure 10B:
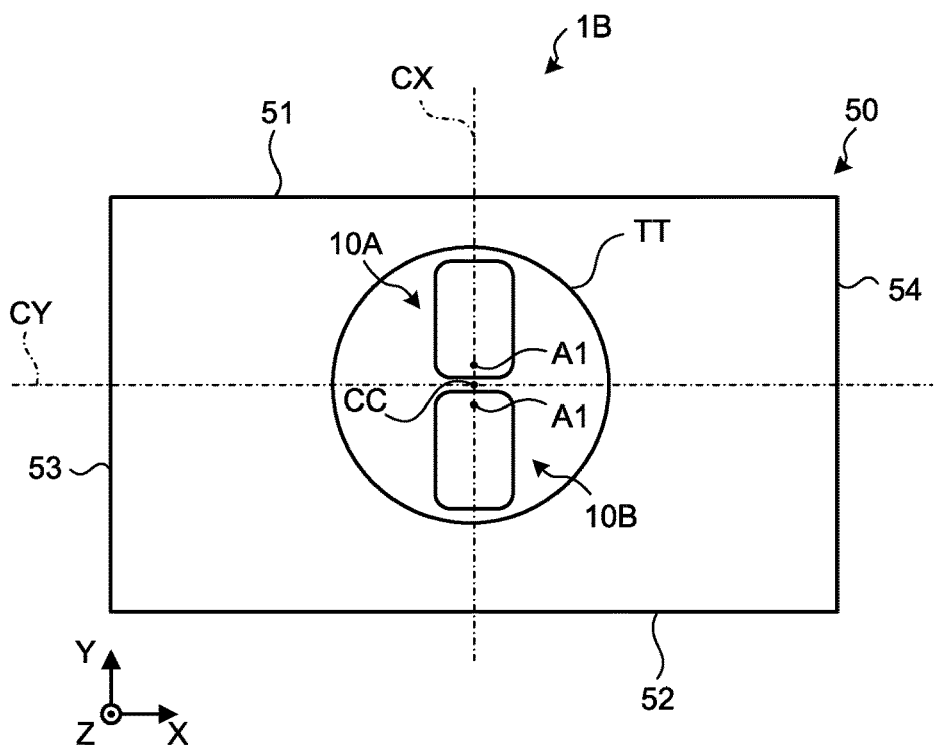
FIG. 10B is an explanatory diagram of a second variation.
Figure 10C:
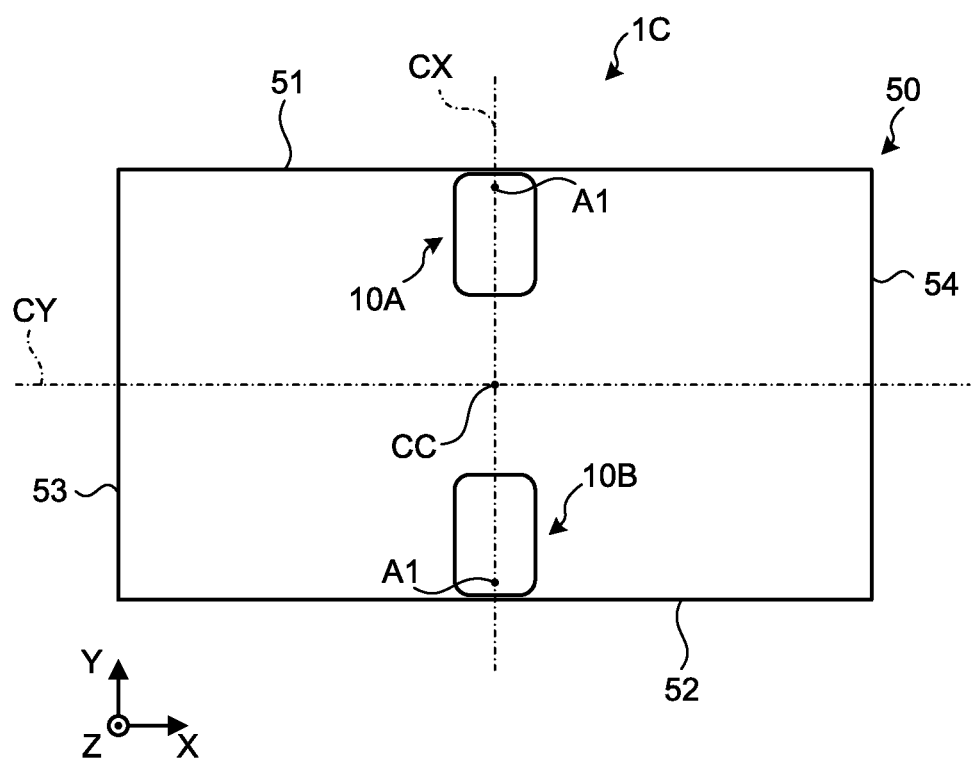
FIG. 10C is an explanatory diagram of a third variation.

Next, variations of the transfer system 1 will be described by using FIG. 10A, FIG. 10B, and FIG. 10C. FIG. 10A is an explanatory diagram of a first variation, FIG. 10B is an explanatory diagram of a second variation, and FIG. 10C is an explanatory diagram of a third variation. Herein, FIG. 10A, FIG. 10B, and FIG. 10C are schematic top views similar to FIG. 1, but the transfer positions P, the arm parts 19 of the robots 10, etc., are omitted for the sake of better understanding of explanation. Additionally, the layout of the transfer positions P is similar to that of FIG. 1.

First, the first variation will be described. FIG. 10A illustrates a transfer system 1A that is a variation of the transfer system 1 with respect to arrangement of the robots 10A and 10B. The transfer system 1A is different from the transfer system 1 illustrated in FIG. 1 in that the arrangement of the robots 10A and 10B illustrated in FIG. 1 is rotated by 90 degrees in a counterclockwise direction with respect to the center point CC. That is, the first axis A1 of the robot 10A and the first axis A1 of the robot 10B are located on the center line CY at symmetrical positions with respect to the center line CX.

Even when the robots 10A and 10B are thus arranged, it is possible to execute a transfer process similar to that of the transfer system 1. That is, the robot 10A is capable of executing the transfer process for the transfer positions P11, P12, P13, P31, P32, and P51, and the robot 10B is capable of executing the transfer process for the transfer positions P21, P22, P23, P41, P42, and P52.

Additionally, in the case illustrated in FIG. 10A, the transfer position P51 among the transfer positions P51 and P52 that correspond to the pre-aligners PA (see FIG. 7) is closer to the robot 10A, so that the robot 10A executes the transfer process for the transfer position P51 and the robot 10B executes the transfer process for the transfer position P52. Additionally, the robot 10A may execute the transfer process for the transfer position P52 and the robot 10B may execute the transfer process for the transfer position P51.

Furthermore, although FIG. 10A illustrates the transfer system 1A in which the arrangement of the robots 10A and 10B illustrated in FIG. 1 is rotated by 90 degrees in a counterclockwise direction with respect to the center point CC, the transfer system 1A may be provided in which it is rotated by 90 degrees in a clockwise direction.

Next, the second variation will be described. FIG. 10B illustrates a transfer system 1B that is a variation including an interchanging part TT that interchanges positions and orientations of the robots 10A and 10B. The transfer system 1B is different from the transfer system 1 illustrated in FIG. 1 in that the interchanging part TT is provided instead of the supporting devices 110A and 110B illustrated in FIG. 1.

Additionally, the first axis A1 of the robot 10A and the first axis A1 of the robot 10B are located on the center line CX at symmetrical positions with respect to the center line CY, similarly to the transfer system 1 illustrated in FIG. 1. Furthermore, the robots 10A and 10B are provided on the interchanging part TT.

The interchanging part TT is, for example, a disc-shaped turntable that rotates about the center point CC, for example. The interchanging part TT rotates by 180 degrees about the center point CC from the state illustrated in FIG. 10B so that it is possible to interchange the positions and the orientations of the robot 10A and the robot 10B. That is, the interchanging part TT interchanges in-plane positions of the two robots 10A and B.

For example, when the robot 10B is broken down, the interchanging part TT is appropriately caused to reversely rotate so that it is possible to interchange, with respect to the robot 10A, the position and the orientation of the robot 10A with the position and the orientation of the robot 10B illustrated in FIG. 10B.

Specifically, the robot 10A executes the transfer process for the transfer positions P11, P12, P13, P31, P32, and P51 assigned to the robot 10A at the position indicated in FIG. 10B. Then, in a state in which the interchanging part TT is rotated by 180 degrees about the center point CC, the transfer process for the transfer positions P21, P22, P23, P41, P42, and P52 that are originally assigned to the robot 10B is executed.

Thus, the interchanging part TT is caused to rotate in increments of 180 degrees, so that even when the robot 10B is broken down, it is possible for the robot 10A to continuously execute the transfer process related to all of the transfer positions P in the transfer chamber 50. Similarly, even when the robot 10A is broken down, it is possible for the robot 10B to continuously execute the transfer process related to all of the transfer positions P in the transfer chamber 50.

Additionally, although FIG. 10B illustrates the turntable as an example of the interchanging part TT, it may be possible to use another moving mechanism such as a sliding mechanism may be used as long as the positions and the orientations of the robots 10A and 10B are interchangeable.

Next, the third variation will be described. FIG. 10C illustrates a transfer system 1C that is a variation of the transfer system 1 with respect to arrangement of the robots 10A and 10B. The transfer system 1C is different from the transfer system 1 illustrated in FIG. 1 in that the arrangement of each of the robots 10A and 10C illustrated in FIG. 1 is closer to the first side wall 51 and the second side wall 52, the first axis A1 of the robot 10A is closer to the first side wall 51, and the first axis A1 of the robot 10B is closer to the second side wall 52. Additionally, the first axis A1 of the robot 10A and the first axis A1 of the robot 10B are located on the center line CX at symmetrical positions with respect to the center line CY.

Even when the robots 10A and 10B are thus arranged, it is possible to execute a transfer process similar to that of the transfer system 1. That is, the robot 10A is capable of executing the transfer process for the transfer positions P11, P12, P13, P31, P32, and P51, and the robot 10B is capable of executing the transfer process for the transfer positions P21, P22, P23, P41, P42, and P52.

Additionally, the robot 10A may be arranged as illustrated in FIG. 10C while the robot 10B may be arranged as illustrated in FIG. 1. Furthermore, the robot 10A may be arranged as illustrated in FIG. 1 while the robot 10B may be arranged as illustrated in FIG. 10C.

As described above, the transfer system 1 according to the present embodiment includes the transfer chamber 50, the two robots 10, and the supporting devices 110 as an example of the "retreat unit". The plurality of transfer positions P are determined preliminarily in the transfer chamber 50. Each of the two robots 10 is provided in the transfer chamber 50, and includes the horizontal articulated arm part 19 that transfers the substrate 500 between the plurality of transfer positions P. The supporting devices 110 as an example of the retreat unit, when one of the robots 10 is broken down, cause the broken-down robot 10 to retreat to a height at which interference with an operating range of the other of the robots 10 is not caused.

Thus, the transfer system 1 causes the broken-down robot 10 to retreat in such a manner that interference with the normal robot 10 is not caused, so that it is possible to prevent an increase in costs and continue the transfer process even when the robot 10 is broken down.

Additionally, although the case where the supporting devices 110 that cause the broken robots 10 to retreat are separated from the robots 10 has been explained in the embodiment described above, the supporting devices 110 may be omitted by further extending the lifting range W61 (see FIG. 7) of the lifting parts 16 (see FIG. 3) of the robots 10 by the lift-down width W of the supporting devices 110 (see FIG. 2). In such a case, the lifting parts 16 of the robots 10 correspond to the "retreat unit".

Additionally, in order to extend the lifting range W61 of the aim parts 19 in the robots 10, it is possible to provide the lifting mechanisms of the robots 10 that is configured as multi-tube telescopic systems or the lifting axis A0 that is configured with a multi-stage system such as two-stage system. Thus, it is possible to reduce the height of the main body part 15 and extend the lifting range W61 so as to allow retreat at the time of breakdown.

Furthermore, the "retreat unit" may be omitted from the transfer system 1, so that if one of the robots 10 is broken down, the other of the robots 10 also transfers the substrate 500 to the transfer positions P that correspond to the broken-down robot 10. That is, each of the robots 10 may be configured to operate so as to compensate for all of the transfer positions P that correspond to all of the robots 10. Furthermore, when one of the robots 10 is stopped, the other of the robots 10 may also transfer the substrate 500 for the transfer positions P that corresponds to the stopped robot 10.

It is possible for those skilled in the art to readily derive additional advantages and variations. Hence, broader aspects of the present invention are not limited to the specific details and representative embodiments as illustrated and described above. Therefore, it is possible to provide various modifications without departing from the spirit and scope of the general inventive concept as defined by the appended claims and equivalents thereof.

Obviously, numerous modifications and variations of the present invention are possible in light of the above teachings. It is therefore to be understood that within the scope of the appended claims, the invention may be practiced otherwise than as specifically described herein.

What is claimed is:

1. A transfer system comprising:
a transfer chamber having transfer positions;
a first robot provided in the transfer chamber to transfer articles between the transfer positions;
a second robot provided in the transfer chamber to transfer articles between the transfer positions;
a controller configured to execute operation control of one robot among the first robot and the second robot;
a determining unit configured to determine that the one robot has error information indicating that the one robot is broken down; and
a lift configured to move the one robot to a retreat position by changing a height of the one robot such that the one robot does not interfere with an operating range of another robot among the first robot and the second robot, the lift being configured to move the one robot to the retreat position when the determining unit determines that the one robot is broken down.

2. The transfer system according to claim 1,
wherein the first robot includes a first horizontal articulated arm to transfer a substrate, and
wherein the second robot includes a second horizontal articulated arm to transfer a substrate.

3. The transfer system according to claim 2, wherein
the transfer chamber includes a first side wall and a second side wall that face each other, and a third side wall and a fourth side wall that face each other,
each of the first side wall and the second side wall includes a same number of cassettes that house the substrate,
each of the third side wall and the fourth side wall includes a same number of load lock chambers that are chambers prior to a processing chamber for processing the substrate,
the first robot is configured to transfer the substrate between the cassettes provided in the first side wall and the load lock chambers provided in the third side wall, and
the second robot is configured to transfer the substrate between the cassettes provided in the second side wall and the load lock chambers provided in the fourth side wall.

4. The transfer system according to claim 3, wherein
each of the first robot and the second robot has an arm length for transferring the substrate to each of the transfer positions that correspond to the first side wall, the second side wall, the third side wall, and the fourth side wall, and
the another robot is configured to transfer the substrate between the transfer positions between which the one robot is supposed to transfer the substrate.

5. The transfer system according to claim 2, wherein
the first and second robots include lifting parts that lift the arm up and down, and
the lift lowers the lifting part to move the arm of the one robot to a retreat height at which the one robot does not interfere with an operating range of the another robot.

6. The transfer system according to claim 1, further comprising:
an additional lift configured to move the another robot to the retreat position by changing a height of the another robot such that the another robot does not interfere with an operating range of the one robot, the additional lift being configured to move the another robot to the retreat position when the one robot is broken down, wherein
the lift is configured to descend to lower a height of the one robot when the one robot is broken down, and
the additional lift is configured to descend to lower a height of the another robot when the another robot is broken down.

7. The transfer system according to claim 6, wherein the lift and the additional lift are configured to take a plurality of support heights that include a first height before retreating and a second height after retreating that is less than the first height.

8. The transfer system according to claim 1, further comprising:
circuitry configured to change a posture of an arm of the one robot to a retreat posture.

9. The transfer system according to claim 1, further comprising:
a turntable configured to interchange in-plane positions of the first robot and the second robot.

10. A transfer method comprising:
providing a first robot in a transfer chamber to transfer articles between the transfer positions in the transfer chamber;
providing a second robot in the transfer chamber to transfer articles between the transfer positions in the transfer chamber;
determining by a determining unit that a controller configured to execute operation control of one robot among the first robot and the second robot has error information indicating that the one robot is broken down; and
moving the one robot
among the first robot and the second robot to a retreat position by changing a height of the one robot such that the one robot does not interfere with an operating range of another robot among the first robot and the second robot, the one robot being moved to the retreat position when it is determined that the one robot is broken down.

* * * * *